(12) United States Patent
Takano (10) Patent No.: US 7,148,769 B2
(45) Date of Patent: Dec. 12, 2006

(54) SURFACE ACOUSTIC WAVE DEVICE AND PROCESS FOR FABRICATING THE SAME

(75) Inventor: Atsushi Takano, Suita (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 103 days.

(21) Appl. No.: 11/076,134

(22) Filed: Mar. 10, 2005

(65) Prior Publication Data
US 2005/0200434 A1 Sep. 15, 2005

(30) Foreign Application Priority Data

Mar. 15, 2004 (JP) ............................. 2004-072563
Nov. 10, 2004 (JP) ............................. 2004-326189

(51) Int. Cl.
*H03H 9/64* (2006.01)
*H03H 9/25* (2006.01)
*H03H 3/08* (2006.01)

(52) U.S. Cl. .................. 333/193; 310/313 B; 29/25.35
(58) Field of Classification Search ................ 333/193; 310/313 B
See application file for complete search history.

(56) References Cited

U.S. PATENT DOCUMENTS

| 3,283,264 A | 11/1966 | Papadakis .................... 333/133 |
| 4,012,650 A * | 3/1977 | Pratt et al. ............... 310/313 C |
| 4,163,201 A * | 7/1979 | Takahashi et al. .......... 333/194 |
| 4,388,600 A | 6/1983 | Wakino et al. ............... 333/151 |
| 5,708,402 A * | 1/1998 | Hachisu et al. ............. 333/133 |

FOREIGN PATENT DOCUMENTS

| DE | 196 26 410 | | 1/1998 | |
| EP | 0 701 812 | | 4/1996 | |
| JP | 62-26619 | * | 2/1987 | ........ 369/FOR. 154 |
| JP | 62-40811 | * | 2/1987 | ................. 333/193 |
| JP | 3-165116 | * | 7/1991 | ................. 333/193 |
| JP | 11-68496 | * | 3/1999 | |
| JP | 2000-278090 | * | 10/2000 | |
| JP | 2002-246876 | * | 8/2002 | |

* cited by examiner

*Primary Examiner*—Barbara Summons
(74) *Attorney, Agent, or Firm*—Wenderoth, Lind & Ponack, L.L.P.

(57) ABSTRACT

A surface acoustic wave device has a piezoelectric substrate 1, and a comb transducer 2 formed on a surface of the piezoelectric substrate 1. Grooves 5 for eliminating an unnecessary wave are formed in a back surface of the surface acoustic wave device in such a manner that the interval of the adjoining grooves 5 is decreased as the groove 5 extends from one end 7 of the piezoelectric substrate 1 to the other end 8 thereof. With this arrangement, angles defined by the extending directions of the respective grooves 5 and the propagating direction of the surface acoustic wave can be differentiated from each other, and the reflecting conditions of the unnecessary wave to the respective grooves 5 can be varied from each other. This arrangement enables to improve characteristics of the surface acoustic wave device.

16 Claims, 6 Drawing Sheets

SURFACE ACOUSTIC WAVE DEVICE AND PROCESS FOR FABRICATING THE SAME

BACKGROUND OF THE INVENTION

1. Field of the Invention

The present invention relates to a surface acoustic wave device, and a process for fabricating the same.

2. Description of the Related Art

Generally, a surface acoustic wave device such as a surface acoustic wave (SAW) filter has a comb transducer comprised of an electrode pair on a transmitting side (simply called as "transmitting electrode") and an electrode pair on a receiving side (simply called as "receiving electrode") on a surface of a piezoelectric substrate. The transmitting electrode and the receiving electrode each has a pair of electrodes constructed such that an anode and a cathode intersect with each other. A surface acoustic wave excited by the transmitting electrode is propagated over the surface of the piezoelectric substrate, and is received by the receiving electrode for output.

In the piezoelectric substrate constituting the surface acoustic wave device, there is a wave other than the surface acoustic wave which is propagated from the transmitting electrode to the receiving electrode. Such an unnecessary, wave is propagated through the interior of the piezoelectric substrate, reflected on a back surface of the substrate, and is detected as an unnecessary wave signal. The unnecessary wave signal may adversely affect device characteristics if being received by the receiving electrode. In an attempt to eliminate the drawback, Japanese Unexamined Patent Publication No. 56-132806 discloses a technique in which plural grooves extending in a direction intersecting with the propagating direction of a surface acoustic wave are formed in a back surface of a piezoelectric substrate to vary the reflecting directions of the unnecessary wave on the back surface of the substrate for the purpose of reducing the unnecessary wave signal and suppressing adverse effects of the unnecessary wave signal.

Since the grooves for reducing the unnecessary wave signal are generally formed by a diamond cutter or a router, the grooves have a linear configuration and are formed equidistantly spaced apart from each other. Therefore, the reflecting conditions of the unnecessary wave to the respective grooves are identical to each other, which makes it difficult to provide advanced measures for reducing the unnecessary wave signal.

SUMMARY OF THE INVENTION

In view of the problems residing in the prior art, it is an object of the present invention to provide a surface acoustic wave device that enables to improve performance of the device by suppressing propagation of an unnecessary wave.

An aspect of the invention is directed to a surface acoustic wave device comprising: a piezoelectric substrate; a comb transducer which is formed on a surface of the piezoelectric substrate; and a plurality of grooves which are formed in a back surface of the piezoelectric substrate in a direction intersecting with a propagating direction of a surface acoustic wave, an interval of the adjoining grooves being decreased as the groove extends from one end of the piezoelectric substrate to the other end thereof.

In the above arrangement, the plurality of grooves are formed in the back surface of the piezoelectric substrate. Since the grooves extend in the direction intersecting with the propagating direction of the surface acoustic wave, unlike an arrangement that grooves extend substantially parallel to the propagating direction of the surface acoustic wave, this arrangement enables to increase the degree of variance of reflection of the surface acoustic wave (unnecessary wave) that has been sent from the transmitting electrode of the comb transducer and reached the back surface of the substrate. Thus, there is no or less likelihood that the unnecessary wave reflected on the grooves may be received by the receiving electrode of the comb transducer, and the surface acoustic wave device exhibits good device characteristics with less or no noise.

There is likelihood that a surface acoustic wave of a specific wavelength may be selectively reflected depending on the interval (pitch) of the adjoining grooves if the interval (pitch) of the adjoining grooves is identical among the grooves, even if the grooves substantially extend in the direction interesting with the propagating direction of the surface acoustic wave. In view of this, preferably, the grooves are formed in such a manner that the interval of the adjoining grooves is decreased as the groove extends from one end of the surface acoustic wave device toward the other end thereof, wherein the one end and the other end are each located on a side substantially perpendicular to the propagating direction of the surface acoustic wave. This arrangement enables to maximize the degree of variance of reflection of the unnecessary wave with respect to all the possible wavelengths, thereby effectively suppressing adverse effects of the unnecessary wave.

Another aspect of the invention is directed to a process for fabricating a surface acoustic wave device provided with a piezoelectric substrate, a comb transducer formed on a surface of the piezoelectric substrate, and a plurality of grooves formed in a back surface of the piezoelectric substrate in a direction intersecting with a propagating direction of a surface acoustic wave, the grooves being formed in such a manner that an interval of the adjoining grooves is decreased as the groove extends from one end of the piezoelectric substrate to the other end thereof, wherein the plurality of grooves are formed by grinding.

The above arrangement enables to maximize the degree of variance of reflection of the unnecessary wave on the back surface of the piezoelectric substrate, and realize a surface acoustic wave device capable of effectively suppressing adverse effects of the unnecessary wave. Further, since the grinding technique is employed, a thick affected layer in which crystalline structure of the substrate is modified by a stress applied to the substrate in forming the plurality of grooves is formed in a region on the back side of the piezoelectric substrate. Since the unnecessary wave is reflected at random in the affected layer, adverse effects of the unnecessary wave can be effectively suppressed.

These and other objects, features and advantages of the present invention will become more apparent upon reading of the following detailed description along with the accompanying drawings.

DETAILED DESCRIPTION OF THE PREFERRED EMBODIMENTS

In the following, preferred embodiments of the present invention are described referring to the accompanying drawings. Throughout the specification and the claims, a surface of a piezoelectric substrate which is opposite to a surface where electrodes are formed, and in which grooves are formed is referred to as "a back surface of the substrate".

Figure 1:
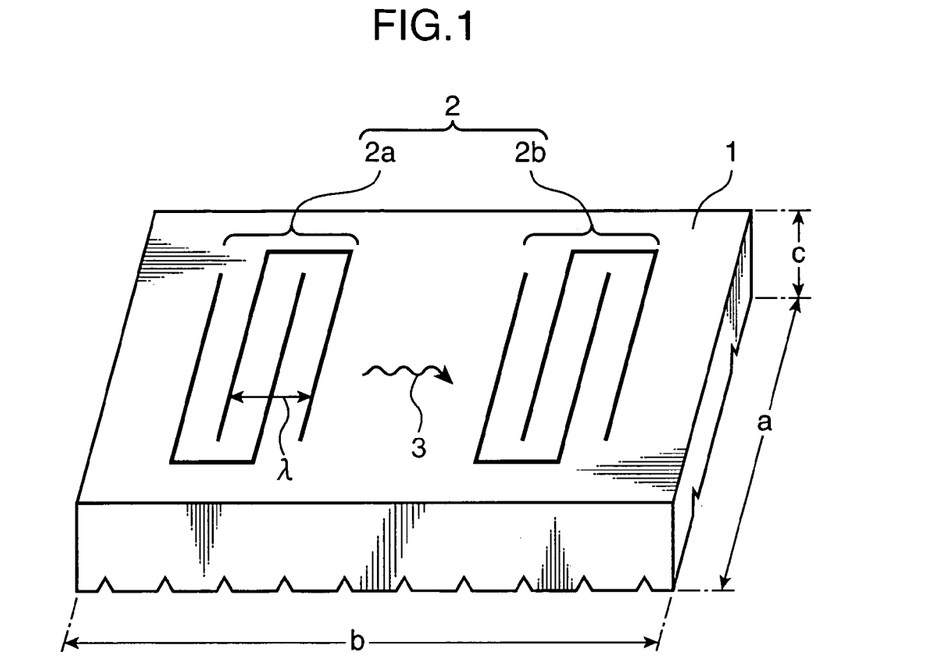
FIG. 1 is a perspective view of a surface acoustic wave filter as an example of a surface acoustic wave device embodying the present invention.

FIG. 1 is a perspective view of a surface acoustic wave filter as an example of a surface acoustic wave device embodying the invention. As shown in FIG. 1, the acoustic surface wave filter is constructed such that electrode pairs 2a and 2b constituting a comb transducer 2 are arranged opposing to each other on a piezoelectric substrate 1 made of $LiTaO_3$ or $LiNbO_3$ in a propagating direction of a surface acoustic wave 3. The surface of the piezoelectric substrate 1 is distorted by an electrical signal inputted to the electrode pair 2a on a transmitting side (hereinafter, called as "transmitting electrode 2a"), and the distortion is propagated as the surface acoustic wave 3 to the electrode pair 2b on a receiving side (hereinafter, called as "receiving electrode 2b"). The surface acoustic wave 3 is converted into an electric signal by the receiving electrode 2b, whereby the surface acoustic wave filter exhibits filter characteristics.

In the embodiment shown in FIG. 1, the thickness c of the piezoelectric substrate 1 is 0.15 mm, the shorter side a thereof is 0.7 mm, and the longer side b thereof is 1.3 mm. The wavelength of the surface acoustic wave to be propagated is equal to the pitch (shown by λ in FIG. 1) between an anode and a cathode of the transmitting electrode 2a. Further, there is a relation: $V_0 = f_C \cdot \lambda$ where λ represents a wavelength of the surface acoustic wave 3, $f_C$ represents a center frequency of the surface acoustic wave filter, and $V_0$ represents a velocity of a sound propagating through the piezoelectric substrate 1. In this embodiment, the wavelength λ is 2.1 μm, and the center frequency $f_C$ is 1842.5 MHz.

Figure 2:
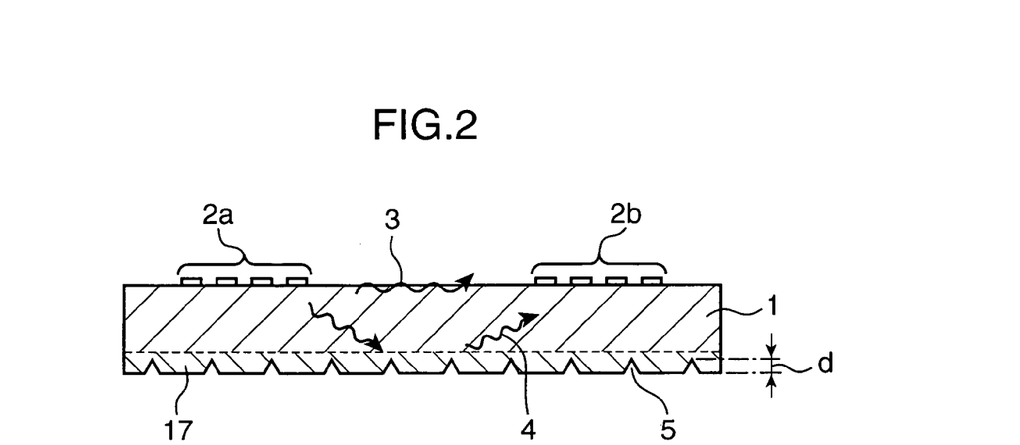
FIG. 2 is a cross-sectional view of the surface acoustic wave filter showing how a wave signal is propagated in the filter.

FIG. 2 is a cross-sectional side view of the surface acoustic wave filter shown in FIG. 1. As shown in FIG. 2, in the surface acoustic wave filter, there is a wave 4 (called as "unnecessary wave 4") other than the surface acoustic wave 3 which is propagated over the surface of the piezoelectric substrate 1. The unnecessary wave 4 from the transmitting electrode 2a constituting the comb transducer 2 is propagated through the interior of the piezoelectric substrate 1, reflected on the back surface of the substrate 1, and is received by the receiving electrode 2b. Conventionally, plural linear grooves extending in a direction orthogonal to the propagating direction of a surface acoustic wave are formed in a back surface of a piezoelectric substrate to suppress such an unnecessary wave.

Figure 3:
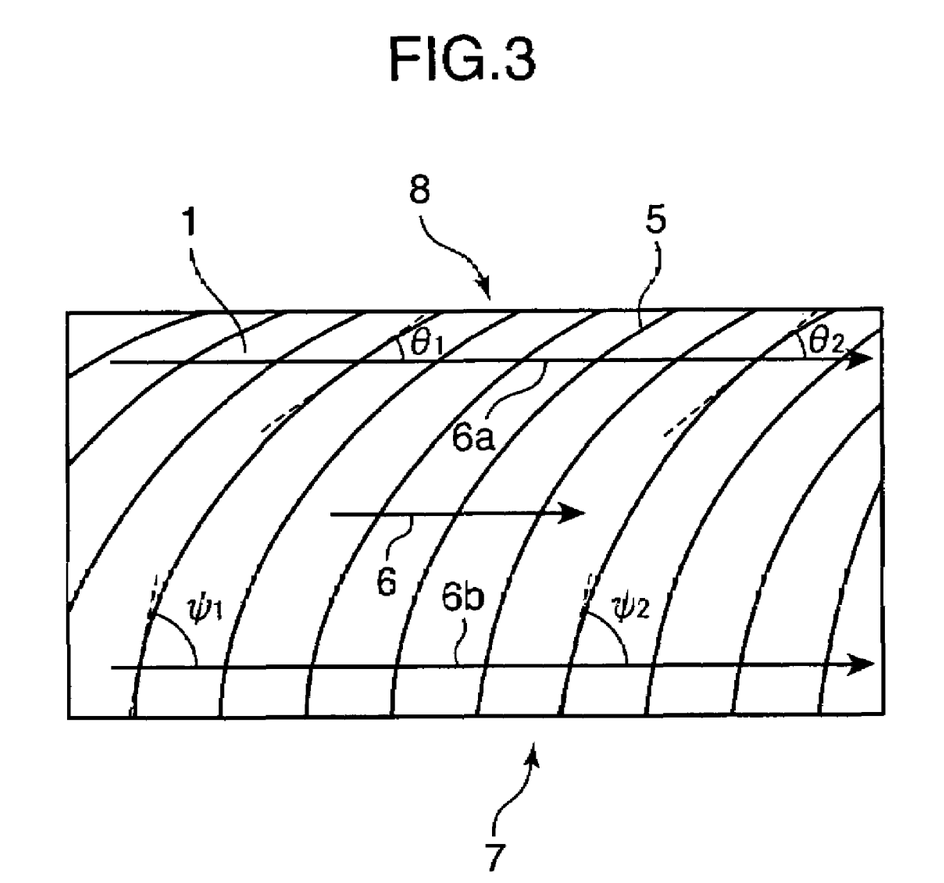
FIG. 3 is a bottom view of the surface acoustic wave filter.

In the surface acoustic wave filter according to the embodiment of the present invention, plural curved grooves 5 are formed in the back surface of the substrate 1 with their extending directions substantially orthogonal to the propagating direction of the surface acoustic wave 3. Specifically, the angle defined by the propagating direction of the surface acoustic wave 3 and each groove 5 is near a right angle. FIG. 3 is a bottom view of the surface acoustic wave filter shown in FIGS. 1 and 2. As shown in FIG. 3, in the embodiment of the invention, the extending direction of each groove 5 formed in the back surface of the piezoelectric substrate 1 substantially intersects with the propagating direction of the surface acoustic wave 3 shown by the arrow 6. Further, the interval of the adjoining grooves 5 is reduced as the groove 5 extends from one end 7 of the substrate 1 toward the other end 8 of the substrate 1. With this arrangement, the angles defined by the extending directions of the respective grooves 5 and the propagating direction 6 of the surface acoustic wave 3 are differentiated from each other among the grooves 5, which makes it possible to vary the reflecting conditions of the unnecessary wave 4 on the respective grooves 5.

More precisely, the configuration of the curved grooves 5 is such that, as shown in FIG. 3, when angles defined by tangential lines of arbitrary two grooves 5 at intersecting points at which the two grooves 5 intersect with a line segment 6a parallel to the propagating direction 6 of the surface acoustic wave 3, and the line segment 6a are $\theta_1$ and $\theta_2$, respectively, these angles $\theta_1$ and $\theta_2$ are different from each other. Likewise, when angles defined by tangential lines of these two grooves 5 at intersecting points at which the two grooves 5 intersect with another line segment 6b parallel to the propagating direction 6 of the surface acoustic wave 3, and the line segment 6b are $\psi_1$ and $\psi_2$, respectively, these angles $\psi_1$ and $\psi_2$ are different from each other. In this way, it is desirable to differentiate angles defined by tangential lines of the grooves 5 and a line segment parallel to the propagating direction 6 of the surface acoustic wave 3 from each other over the entirety of the back surface of the piezoelectric substrate 1. In other words, it is desirable that the grooves 5 have curvatures with the same sign (+ or −), and that the curvature is increased as each groove 5 extends from the one end 7 of the substrate 1 toward the other end 8 thereof. This arrangement enables to increase the degree of variance of the unnecessary wave 4 that is reflected on the back surface of the piezoelectric substrate 1, as compared with the conventional arrangement having the linear grooves, thereby suppressing adverse effects of the unnecessary wave 4 to filter characteristics.

Generally, in the case where a wave is scattered (reflected) on a scatterer, it is impossible to perform effective scattering if the size of the scatterer is exceedingly small, as compared with the wavelength of the wave. In view of this, in this embodiment, the depth d of the groove 5, which is a value measured from the back surface of the piezoelectric substrate 1 shown in FIG. 2, has a lower limit in accordance with the wavelength k of the surface acoustic wave 3, so that adverse effects of the unnecessary wave 4 can be effectively suppressed as far as the depth d lies in a certain range including the lower limit. In this embodiment, preferably, the depth d of the groove 5 is not smaller than 0.5%, more preferably not smaller than 1.0%, and furthermore preferably, about 5.0% relative to the wavelength λ of the surface acoustic wave 3.

The unnecessary wave 4 is effectively scattered as far as the depth d of the groove 5 is not smaller than the aforementioned lower limit. Accordingly, there is no constraint regarding a relation to the wavelength λ of the surface acoustic wave 3, as far as the depth d of the groove 5 satisfies the above requirement. However, if the depth d of the groove 5 transgresses an upper limit, it is likely that crack may be generated in the piezoelectric substrate 1. In view of this, preferably, the depth d of the groove 5 is about 1.0 μm or less if the piezoelectric substrate 1 has a thickness c of 0.15 mm as in the embodiment, for instance.

Preferably, the grooves 5 have at least two different depths d from each other rather than an identical depth to each other. More preferably, the cross-sectional shapes of the respective grooves 5 are different from each other rather than identical to each other. For instance, taking an example of the piezoelectric substrate 1 shown in FIG. 2, a certain groove 5 may have a triangular shape in cross section, and another groove 5 may have a rectangular shape in cross section. This arrangement is automatically accomplished if the grooves 5 are formed by a grinding technique using a grinding blade, because the grinding blade inherently has non-uniformity in terms of grinding performance. Thus, by forming the grooves 5 having the above features, the reflecting directions of the unnecessary wave 4 can be effectively varied from each other, thereby suppressing adverse effects of the unnecessary wave 4.

The maximum pitch of the adjoining grooves 5 may be optionally determined depending on the material and the thickness of the piezoelectric substrate 1, the frequency to be used, or other factor, and the interval of the adjoining grooves 5 can be optionally set in such a range as not to transgress the maximum pitch.

In this embodiment, as far as the maximum pitch or interval of the adjoining grooves 5 does not transgress the above limit, it is desirable to set the interval of the adjoining grooves 5 to 10% or more relative to the wavelength λ of the surface acoustic wave 3. More preferably, the interval of the adjoining grooves 5 is not smaller than 100% and not larger than 150% relative to the wavelength λ of the surface acoustic wave 3. If, on the other hand, the maximum pitch of the adjoining grooves 5 transgresses the upper limit, the number of grooves per unit length is decreased, which may weaken the effect of scattering the unnecessary wave 4. In view of this, preferably, the interval of the adjoining grooves 5 is not larger than 500% relative to the wavelength λ of the surface acoustic wave 3. This arrangement enables to effectively vary the reflecting directions of the unnecessary wave 4 on the grooves 5, thereby suppressing adverse effects of the unnecessary wave 4.

Linear grooves as formed in the conventional art may act as notches, which may break the piezoelectric substrate 1 if a bending stress is applied to the piezoelectric substrate 1. Such an arrangement obstructs the idea of reducing the thickness of the piezoelectric substrate 1, and may be a demerit in a trend in which production of a thin surface acoustic wave filter is progressed. On the other hand, forming the grooves 5 into a curved shape enables to improve strength of the substrate 1 against a bending stress, in addition to improvement on filter characteristics, as mentioned above. In other words, the arrangement of the embodiment enables to minimize the thickness of the piezoelectric substrate 1, and contributes to fabrication of a thin surface acoustic wave filter.

Figure 4A:
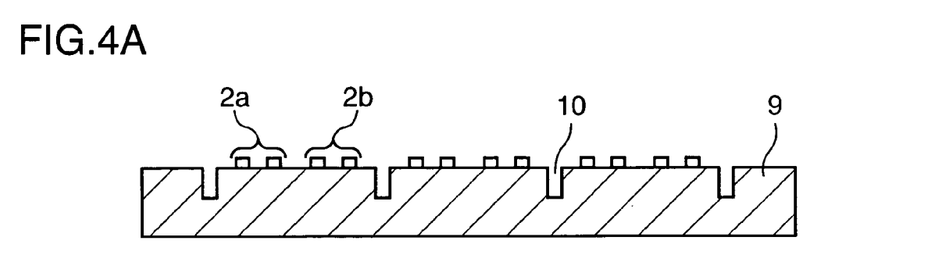
FIG. 4A through 4C are illustrations showing a process for fabricating the surface acoustic wave filter.
Figure 4B:
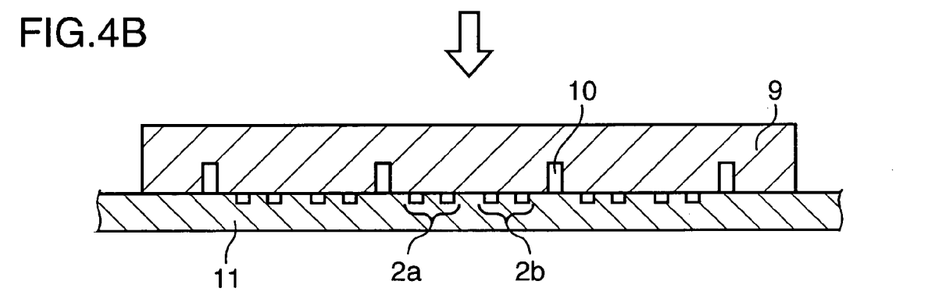
Figure 4C:
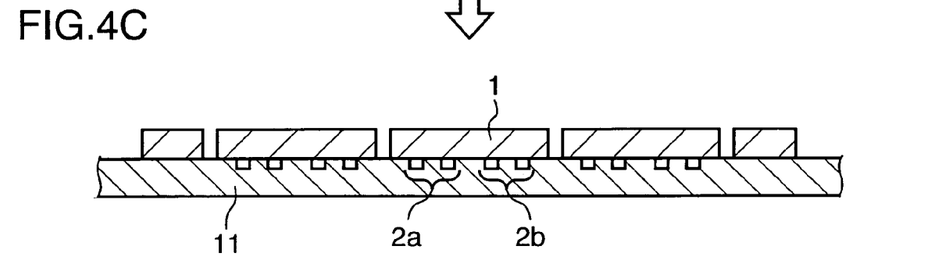

FIG. 4A through 4C are illustrations showing a process for fabricating the inventive surface acoustic wave filter. First, a number of comb transducers 2 each constituted of the transmitting electrode 2a and the receiving electrode 2b are formed along with a corresponding number of half-cut grooves 10 on a surface of a wafer 9 constituted of a piezoelectric member for dividing the wafer 9 into a certain number of blocks, as shown in FIG. 4A. Each block divided by the half-cut grooves 10 corresponds to a piezoelectric substrate 1. In other words, plural piezoelectric substrates 1 can be fabricated simultaneously by forming the half-cut grooves 10 in the wafer 9 and by dividing the wafer 9 into the certain number of blocks.

Subsequently, as shown in FIG. 4B, the surface of the wafer 9 where the transmitting electrodes 2a and the receiving electrodes 2b are formed along with the half-cut grooves 10 is covered with a protective film 11. Then, the back surface of the wafer 9, which is opposite to the surface formed with the transmitting electrodes 2a, the receiving electrodes 2b, and the half-cut grooves 10, is grinded to fabricate a certain pieces of surface acoustic wave filters (see FIG. 4C).

Figure 5:
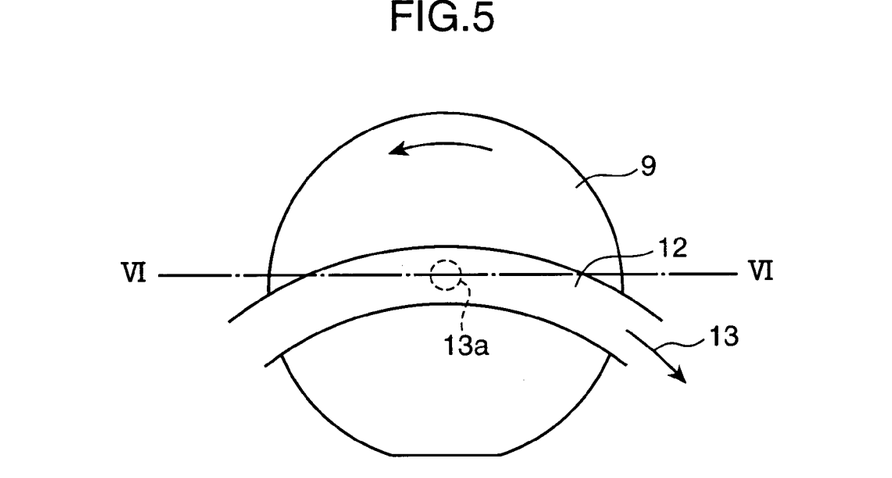
FIG. 5 is an illustration showing a grinding technique in the fabricating process.

FIG. 5 is an illustration showing a manner as to how the back surface of the wafer 9 is grinded. As shown in FIG. 5, a rotating grinding wheel (grinding means) 12 is contacted with a grinding surface of the wafer 9, and the grinding surface is grinded in a rotating direction 13 of the grinding wheel 12. At this time, the grinding site is shifted from one to another by rotating the wafer 9 around an axis of rotation 13a thereof. Thus, the entirety of the grinding surface of the wafer 9 is grinded.

Figure 6:
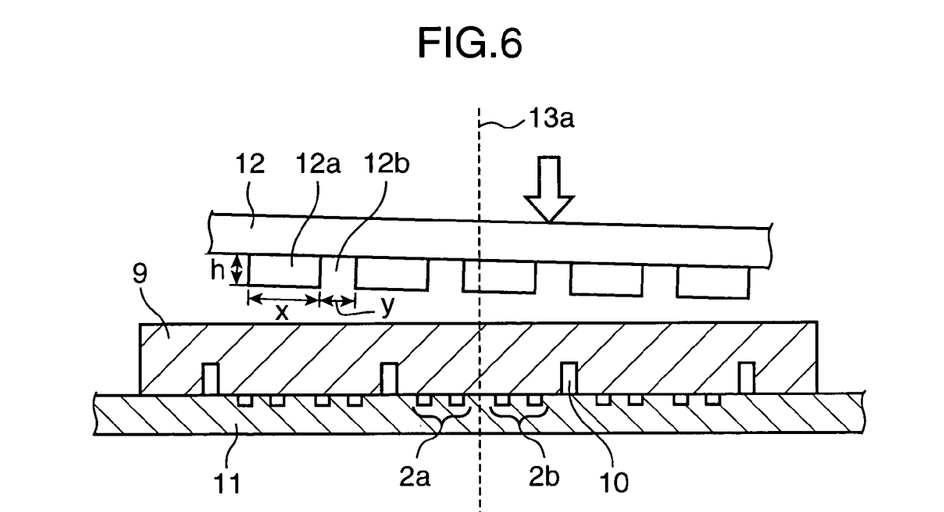
FIG. 6 is a cross-sectional view taken along the line VI—VI in FIG. 5.
Figure 7:
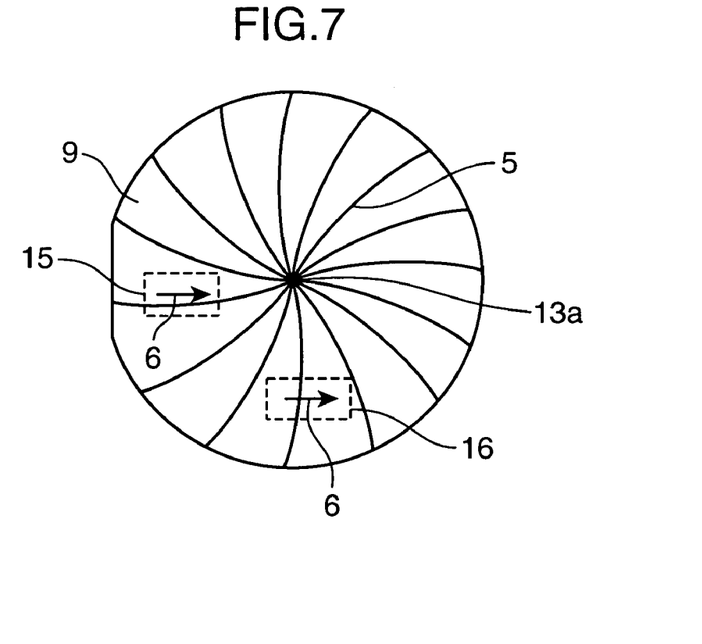
FIG. 7 is an illustration showing how grooves are formed in a back surface of the surface acoustic wave filter by the grinding technique.

FIG. 6 is a cross-sectional view taken along the line VI—VI in FIG. 5. The grinding wheel 12 is arranged as shown in FIG. 6 to be contacted with a substantially half region on the grinding surface of the wafer 9. In this arrangement, as shown in FIG. 7, whorl-like grooves 5 are formed in the wafer 9 around an axis of rotation 13a of the wafer 9. Specifically, each surface acoustic wave filter obtained by dividing the wafer 9 into blocks is formed with curved grooves 5 having a feature that the interval of the adjoining grooves 5 is increased, as each groove 5 extends from one end of the wafer 9 (from the axis of rotation 13a of the wafer 9) toward the other end thereof (toward the outermost perimeter of the wafer 9).

In the case where the whorl-like grooves 5 are formed in the wafer 9, as shown in FIG. 7, an angle defined by the groove 5 in a region enclosed by a dashed line 15, and the propagating direction 6 of the surface acoustic wave 3 is different from an angle defined by the groove 5 in a region enclosed by a dashed line 16, and the propagating direction 6 of the surface acoustic wave 3. Accordingly, suppressing effect of the unnecessary wave 4 may be varied from site to site in the surface acoustic wave filter.

Figure 8:
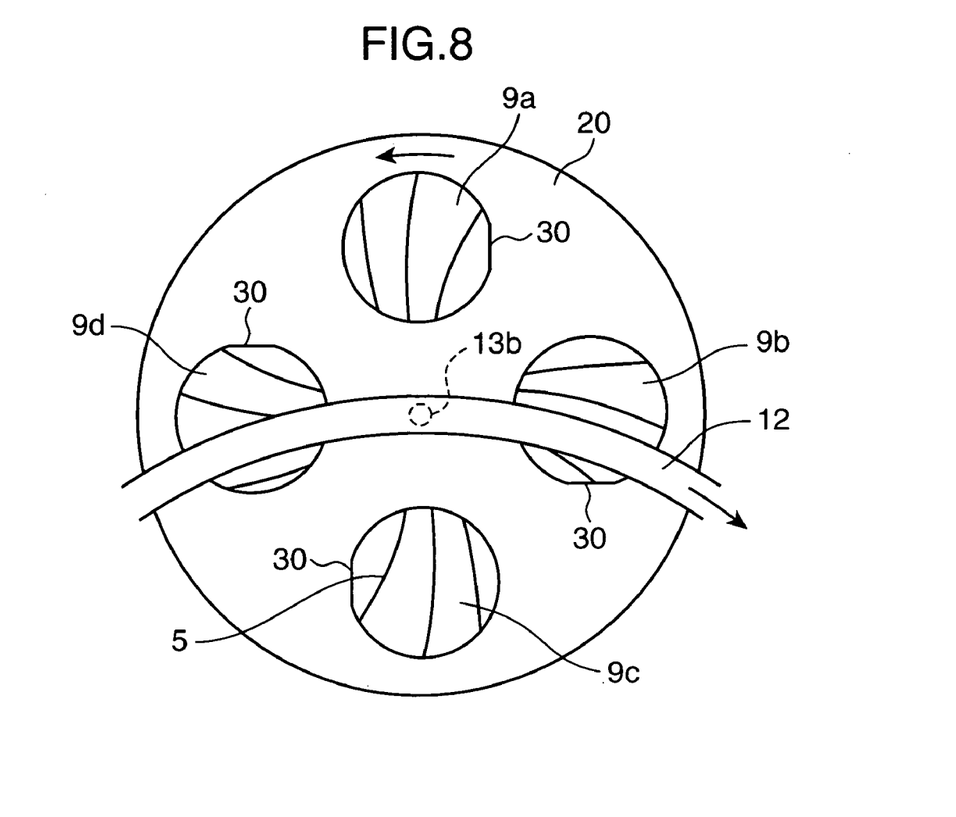
FIG. 8 is an illustration showing an altered grinding technique.

In view of this, as shown in FIG. 8, several wafers 9 are placed on a rotary table 20 rotationally symmetrical to each other for minimizing characteristic variations among surface acoustic wave filters. Specifically, wafers 9a, 9b, 9c, 9d are arranged spaced apart from each other around an axis of rotation 13b of the rotary table 20 equidistantly from the axis of rotation 13b. It is preferable to arrange the wafers 9a, 9b, 9c, 9d at such a position that a linear cutaway portion 30 of each wafer 9b (9c or 9d) is aligned with a cutaway portion 30 of the wafer 9a when the corresponding wafer 9b (9c or 9d) is located at an initial position of the wafer 9a shown in FIG. 8. With this arrangement, the grooves 5 have an identical shape among the wafers 9. In this embodiment, described is a case where four pieces of wafers 9 are arranged on the rotary table 20. Alternatively, the number of wafers 9 may be desirably set.

Figure 9:
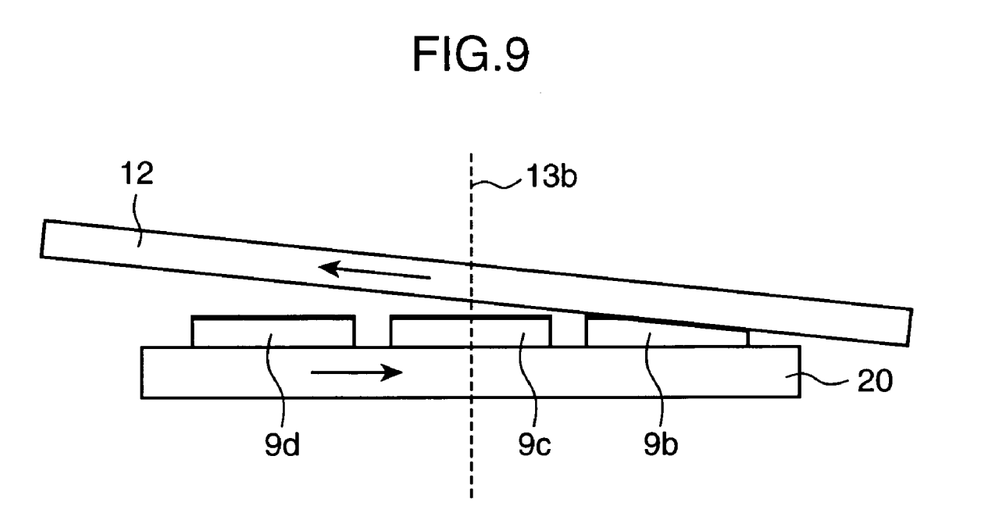
FIG. 9 is a side view of a rotary table, wafers, and a grinding wheel shown in FIG. 8.

FIG. 9 is a side view of the rotary table 20, the wafers 9a, 9b, 9c and 9d (9a is not shown), and the grinding wheel 12. As shown in FIG. 9, the rotary table 20 loaded with the plural wafers 9 is rotated around the axis of rotation 13b. At this time, the grinding wheel 12 is exclusively contacted with the wafer 9b located at a certain spatial position on the rotary table 20 by tilting the grinding wheel 12 relative to the rotating plane of the rotary table 20, or by tilting the rotary table 20 relative to the rotating plane of the grinding wheel 12. Namely, in the states shown in FIGS. 8 and 9, the wafer 9b is grinded, but the wafer 9d is not grinded. With this arrangement, the grooves 5 arrayed in predetermined directions as shown in FIG. 8 are formed in each wafer 9a, 9b, 9c, and 9d successively. This arrangement enables to minimize characteristic variations among the surface acoustic wave filters.

Further, as shown in FIG. 6, it is preferable to use the grinding wheel 12 constituted of plural grinding blades (grinding segments) 12a segmented in the rotating direction of the grinding wheel 12. With this arrangement, grinding chips can be expelled out of the grinding wheel 12 through clearances 12b each defined by the adjoining grinding blades 12a. Further, in this arrangement, it is possible to perform grinding while running water for cleaning. Thereby, clogging of the clearances 12b with grinding chips or crack of the grinding wheel 12 can be avoided, and productivity of the surface acoustic wave filters can be raised. The grinding blades 12a and the clearances 12b may be arranged regularly or irregularly.

Preferably, the length y of the clearance 12b in the rotating direction of the grinding wheel 12 is not smaller than 2.5% and not larger than 50%, and more preferably, not smaller than 5.0% and not larger than 25% relative to the length x of the grinding blade 12a in the rotating direction of the grinding wheel 12 in order to effectively suppress clogging with grinding chips or a like drawback. By setting the lengths x and y in the respective ranges, grinding chips can be sufficiently expelled out of the grinding machine, and a stress applied to the wafer 9 can be minimized, thereby preventing crack of the wafer 9. In the embodiment, the length x of the grinding blade 12a is 20 mm, the length y of the clearance 12b is 2.5 mm, and the height h of the grinding blade 12a is 4.0 mm.

Preferably, the surface roughness of the grinding blade 12a can be varied from each other depending on the depth d of the groove 5 to be formed. For instance, the depth d of the groove 5 is increased, as the surface roughness of the grinding blade 12a is varied from #2000 to #1500 and then to #1200. In view of this, the depth d of the groove 5 can be varied by preparing grinding blades 12a having at least two different surface roughness from each other and by varying the surface roughness of the grinding blade 12a orderly. The surface roughness may be changed alternately, e.g., in the order of #2000, #1500, #2000, #1500, and so on. Further alternatively, the grinding blades 12a may be arranged in such a manner that a certain number of grinding blades 12a of the same surface roughness are arranged in a group, and the surface roughness is varied alternately group by group, e.g., in the order of #2000, #2000, #1500, #1500, #2000, #2000, and so on. Thus, by preparing the grinding blades 12a having the two different surface roughness from each other, the depths of the grooves 5 to be formed in the back surface of the piezoelectric substrate 1 can be varied from each other.

In the case where the grinding blades 12a having three or more different surface roughness are arranged, and the grinding blades 12a having the different surface roughness are disposed adjacent to each other, preferably, the grinding blades 12a are arranged in such a manner that the surface roughness of a certain grinding blade 12a is larger or smaller than the surface roughness of the adjacent grinding blade 12a stepwise, e.g., in the order of #2000, #1500, #1200, #1500, #2000, and so on.

Furthermore preferably, the grinding blades 12a having at least two different surface roughness are arranged orderly, for instance, in the order of #2000, #1500, #1200, #1500, #2000, #1500, #1200, #1500, #2000, and so on. Alternatively, a certain number of grinding blades 12a having the same surface roughness are arranged adjacent to each other in a group, e.g., in the order of #2000, #1500, #1500, #1200, #1500, #1500, #2000, #1500, #1500, #1200, #1500, #1500, #2000, and so on. The order of arranging the grinding blades 12a of different surface roughness, or the number of the grinding blades 12a which have the same surface roughness and are disposed adjacent to each other may be optionally set. Any of the above arrangements enables to vary the depth d of the groove 5 while minimizing a stress applied to the wafer 9, and accordingly, adverse effects of the unnecessary wave 4 can be effectively suppressed.

Preferably, the rotating numbers of the rotary table 20 and the grinding wheel 12 per unit time, and the surface roughness of the grinding blades 12a are controlled in such a manner that the maximum pitch of the adjoining grooves 5 among the grooves 5 of the wafer 9 is not smaller than 10% and not larger than 500%, more preferably, not smaller than 100% and not larger than 150% relative to the wavelength of the surface acoustic wave 3 propagating through the piezoelectric substrate 1.

Furthermore, in the case where the aforementioned grinding technique is employed, a thick affected layer is formed in a region 17 (see FIG. 2) in a region on the back side of the piezoelectric substrate 1. The affected layer 17 is a layer in which crystalline structure of a substrate is modified by a stress applied to a wafer in fabricating a surface acoustic wave filter. Specifically, since the crystalline structure of the affected layer 17 is not uniform, the unnecessary wave 4 is reflected at random in the affected layer 17. Accordingly, propagation of the unnecessary wave 4 is further suppressed in the affected layer 17. There is proposed a polishing technique other than the aforementioned grinding technique using the grinding blades 12a in order to form the grooves 5. It is, however, desirable to adopt the grinding technique capable of forming a thick affected layer, as compared with the polishing technique, in forming the grooves 5 in the piezoelectric substrate 1 to fabricate the surface acoustic wave filter.

In the case where plural surface acoustic wave filters are formed on a single wafer, generally, the maximum pitch of the adjoining grooves 5 may be varied among the surface acoustic wave filters depending on where the surface acoustic wave filter is formed on the wafer. In view of this, the term "maximum pitch or interval" in the specification indicates a pitch of adjoining grooves in a surface acoustic wave filter which is cut out from the vicinity of the center of the wafer.

In this embodiment, the surface acoustic wave filter has been described as an example of the surface acoustic wave device. Alternatively, the invention is applicable to general surface acoustic wave devices in need of suppressing adverse effects of an unnecessary wave propagating in a back surface region of a piezoelectric substrate.

(1) To summarize the invention, a surface acoustic wave device according to an aspect of the invention is a surface acoustic wave device comprising: a piezoelectric substrate; a comb transducer which is formed on a surface of the piezoelectric substrate; and a plurality of grooves which are formed in a back surface of the piezoelectric substrate in a direction intersecting with a propagating direction of a surface acoustic wave, an interval of the adjoining grooves being decreased as the groove extends from one end of the piezoelectric substrate to the other end thereof.

In the above arrangement, the plurality of grooves are formed in the back surface of the piezoelectric substrate. Since the respective grooves extend in the direction intersecting with the propagating direction of the surface acoustic wave, unlike an arrangement that grooves extend substantially parallel with the propagating direction of the surface acoustic wave, the degree of variance of reflection of an unnecessary wave that has been sent from the transmitting electrode of the comb transducer and reached the back surface of the piezoelectric substrate can be increased. Thus, there is no or less likelihood that the unnecessary wave may be received by the receiving electrode of the comb transducer. Thus, the surface acoustic wave device exhibits good device characteristics with less or no noise.

There is likelihood that a surface acoustic wave of a specific wavelength may be selectively reflected if the intervals (pitches) of the adjoining grooves are identical to each other, even if the grooves extend in the direction interesting with the propagating direction of the surface acoustic wave. In view of this, preferably, the grooves are formed in such a manner that the interval of the adjoining grooves is decreased as the groove extends from one end of the surface acoustic wave device toward the other end thereof, wherein the one end and the other end are located on a side substantially perpendicular to the propagating direction of the surface acoustic wave. This arrangement enables to maximize the degree of variance of reflection of the unnecessary wave with respect to all the possible wavelengths, thereby effectively suppressing adverse effects of the unnecessary wave.

(2) In the surface acoustic wave device having the arrangement (1), preferably, each of the plurality of grooves is curved.

In this arrangement, reflecting conditions of the unnecessary wave on the respective grooves can be varied from each other.

(3) In the surface acoustic wave device having the arrangement (1), preferably, each of the plurality of grooves is curved, and all the grooves have curvatures with signs identical to each other.

In this arrangement, since all the grooves have the curvatures with the signs identical to each other, wherein the sign is plus (+) or minus (−), reflecting conditions of the unnecessary wave on the respective grooves can be varied from each other with simple fabrication.

(4) In the surface acoustic wave device having the arrangement (1), preferably, each of the plurality of grooves is curved, all the grooves have curvatures with signs identical to each other, and the curvature is increased as the groove extends from the one end of the piezoelectric substrate to the other end thereof.

In this arrangement, as far as the grooves extend in a direction perpendicular to the propagating direction of the surface acoustic wave, the degree of variance of reflection of the unnecessary wave can be increased owing to the different curvatures of the grooves between the one end and the other end on the back surface of the surface acoustic wave device. This arrangement enables to effectively suppress adverse effects of the unnecessary wave.

(5) In the surface acoustic wave device having the arrangement (1), preferably, each of the plurality of grooves has a depth of not smaller than 0.5% relative to a wavelength of the surface acoustic wave propagating through the piezoelectric substrate.

Generally, if a wave is scattered (reflected) on a scatterer, it is impossible to perform effective scattering on the scatterer if the size of the scatterer is exceedingly small, as compared with the wavelength of the wave. In this arrangement, since the depth of the groove, which is a value measured from the back surface of the piezoelectric substrate, does not fall below a lower limit in accordance with the wavelength of the surface acoustic wave, adverse effects of the unnecessary wave can be effectively suppressed.

(6) In the surface acoustic wave device having the arrangement (1), preferably, a maximum interval of the adjoining grooves among the plurality of grooves is not smaller than 10% and not larger than 500% relative to a wavelength of the surface acoustic wave propagating through the piezoelectric substrate.

Generally, if a wave is scattered (reflected) on a scatterer, it is impossible to perform effective scattering if the interval of the scatterers is exceedingly small or large, as compared with the wavelength of the wave. In this arrangement, since the maximum interval (maximum pitch) of the adjoining grooves has an appropriate value in accordance with the wavelength of the surface acoustic wave, adverse effects of the unnecessary wave can be effectively suppressed.

(7) In the surface acoustic wave device having the arrangement (1), preferably, the plurality of grooves have at least two different depths from each other.

In this arrangement, as compared with a case that grooves have depths identical to each other, the reflecting directions of the unnecessary wave can be varied greatly. This arrangement enables to effectively suppress adverse effects of the unnecessary wave.

(8) A process for fabricating a surface acoustic wave device according to another aspect of the invention is a process for fabricating a surface acoustic wave device provided with a piezoelectric substrate, a comb transducer formed on a surface of the piezoelectric substrate, and a plurality of grooves formed in a back surface of the piezoelectric substrate in a direction intersecting with a propagating direction of a surface acoustic wave, the grooves being formed in such a manner that an interval of the adjoining grooves is decreased as the groove extends from one end of the piezoelectric substrate to the other end thereof, wherein the plurality of grooves being formed by grinding.

This arrangement enables to increase the degree of variance of reflection of the unnecessary wave on the back surface of the piezoelectric substrate, and realize a surface acoustic wave device capable of effectively suppressing adverse effects of the unnecessary wave. Further, since the grinding technique is employed, a thick affected layer in which crystalline structure of the substrate is modified by a stress applied to the substrate in forming the plurality of grooves is formed in a back side region of the piezoelectric substrate. Since the unnecessary wave is reflected at random in the affected layer, adverse effects of the unnecessary wave can be effectively suppressed.

(9) In the fabricating process having the arrangement (8), preferably, at least one comb transducer is formed on a surface of a wafer constituted of a piezoelectric member; said at least one wafer is placed on a rotary table in a state that a back surface of the wafer faces upward, said at least one wafer being arranged in a rotating direction of the rotary table, the rotary table is rotated about an axis of rotation thereof, grinding means is rotated about an axis of rotation thereof, the grinding means being tilted relative to a rotary plane of the rotary table at a predetermined angle in such a manner that the grinding means is contacted with said wafer located at a certain spatial position, whereby a plurality of grooves are formed in the back surface of the wafer.

In the above arrangement, at least one wafer having at least one comb transducer is loaded on the rotary table. At this time, the wafer is loaded on the rotary table in a state that the surface (back surface) opposite to the surface formed with the comb transducer faces upward. Further, in the case where plural wafers are loaded on the rotary table, the wafers are arranged in the rotating direction of the rotary table. Namely, the wafers each having a linear cutaway portion are arranged on the rotary table in such a manner that the cutaway portion of a target wafer to be processed is disposed at the same position on the rotary table every time the target wafer is located at the predetermined position.

Furthermore, the grinding means is rotated about the axis of rotation thereof, and is tilted in such a manner as to be contacted with the target wafer located at the predetermined spatial position. This arrangement makes it possible to form the grooves having a configuration identical to each other among all the wafers loaded on the rotary table.

(10) In the fabricating process having the arrangement (9), preferably, the grinding means includes a plurality of grinding segments segmented in the rotating direction of the grinding means, the adjoining grinding segments being separated from each other by a clearance.

In this arrangement, grinding chips can be expelled out of the grinding means through the clearances each defined by the adjoining grinding segments. Further, in this arrangement, it is possible to perform grinding while running water for cleaning. Thereby, clogging of the clearances with the grinding chips or crack of the grinding means can be avoided, and productivity of the surface acoustic wave devices can be raised.

(11) In the fabricating process having the arrangement (10), preferably, a length of the clearance in the rotating direction of the grinding means is not smaller than 2.5% and not larger than 50% relative to a length of the grinding segment in the rotating direction of the grinding means.

In this arrangement, since the length of the grinding segment to the length of the clearance in the rotating direction of the grinding means is appropriately set, grinding chips can be effectively expelled out of the grinding means through the clearances. Furthermore, since a stress applied to the wafer can be minimized, crack of the wafer can be prevented.

(12) In the fabricating process having the arrangement (10), preferably, the grinding segment has such a surface roughness as to make a depth of the groove formed in the back surface of the wafer of not smaller than 0.5% relative to a wavelength of a surface acoustic wave propagating through the wafer.

In this arrangement, the grooves having the different depths capable of effectively suppressing adverse effects of the unnecessary wave can be formed in the back surface of the surface acoustic wave device.

(13) In the fabricating process having the arrangement (10), preferably, respective rotating numbers of the rotary table and of the grinding means per unit time, and a surface roughness of the grinding segment are controlled in such a manner that a maximum interval of the adjoining grooves among the plurality of grooves is not smaller than 10% and not larger than 500% relative to a wavelength of a surface acoustic wave propagating through the wafer.

In this arrangement, the grooves having the interval capable of effectively suppressing adverse effects of the unnecessary wave can be formed in the back surface of the surface acoustic wave device.

(14) In the fabricating process having the arrangement (10), preferably, the grinding segments have at least two different surface roughness from each other.

As compared with a case where grooves have depths identical to each other, this arrangement enables to form the grooves having the different depths capable of greatly varying the reflecting directions of the unnecessary wave, and effectively suppressing adverse effects of the unnecessary wave.

(15) In the fabricating process having the arrangement (14), preferably, the grinding segments of the grinding means have at least three different surface roughness including a first surface roughness, a second surface roughness, and a third surface roughness, the surface roughness is increased or decreased stepwise in the order from the first, the second, and the third surface roughness, and the grinding segments are arranged in such a manner that the grinding segment having the first surface roughness and the grinding segment having the second surface roughness are disposed adjacent to each other, or the grinding segment having the second surface roughness and the grinding segment having the third surface roughness are disposed adjacent to each other if the grinding segments having the different surface roughness are disposed adjacent to each other.

According to this arrangement, the grooves having the different depths can be formed without exerting an excessive stress to the wafer in the grinding. Accordingly, this arrangement enables to fabricate the surface acoustic wave device capable of effectively suppressing adverse effects of the unnecessary wave, in addition to preventing crack of the wafer.

(16) In the fabricating process having the arrangement (15), preferably, the grinding segments having the different surface roughness are arranged orderly.

According to this arrangement, as compared with a case that grinding segments having different surface roughness are arranged irregularly, a stress to be applied to the wafer can be reduced. Also, in this arrangement, the grooves with the depths thereof being gradually varied can be formed. Accordingly, this arrangement enables to fabricate the surface acoustic wave device capable of effectively suppressing adverse effects of the unnecessary wave in addition to preventing crack of the wafer.

The surface acoustic wave device of the invention is advantageous in suppressing degradation of characteristics arising from reflection on a back surface of a piezoelectric substrate, and is particularly useful in producing communication apparatuses such as mobile phones in need of high performance.

This application is based on Japanese Patent Application No. 2004-072563 and No. 2004-326189 filed on Mar. 15, 2004 and Nov. 10, 2004, respectively, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A surface acoustic wave device comprising:
a piezoelectric substrate;
a comb transducer which is formed on a surface of the piezoelectric substrate; and
a plurality of grooves which are formed in a back surface of the piezoelectric substrate in a direction intersecting with a propagating direction of a surface acoustic wave, an interval of the adjoining grooves being decreased as the groove extends from one end of the piezoelectric substrate to the other end thereof.

2. The surface acoustic wave device according to claim 1, wherein each of the plurality of grooves is curved.

3. The surface acoustic wave device according to claim 1, wherein each of the plurality of grooves is curved, and all the grooves have curvatures with signs identical to each other.

4. The surface acoustic wave device according to claim 1, wherein each of the plurality of grooves is curved, all the grooves have curvatures with signs identical to each other, and the curvature is increased as the groove extends from the one end of the piezoelectric substrate to the other end thereof.

5. The surface acoustic wave device according to claim 1, wherein each of the plurality of grooves has a depth of not smaller than 0.5% relative to a wavelength of the surface acoustic wave propagating through the piezoelectric substrate.

6. The surface acoustic wave device according to claim 1, wherein a maximum interval of the adjoining grooves among the plurality of grooves is not smaller than 10% and not larger than 500% relative to a wavelength of the surface acoustic wave propagating through the piezoelectric substrate.

7. The surface acoustic wave device according to claim 1, wherein the plurality of grooves have at least two different depths from each other.

8. A process for fabricating a surface acoustic wave device provided with a piezoelectric substrate, a comb transducer formed on a surface of the piezoelectric substrate, and a plurality of grooves formed in a back surface of the piezoelectric substrate in a direction intersecting with a propagating direction of a surface acoustic wave, the grooves being formed in such a manner that an interval of the adjoining grooves is decreased as the groove extends from one end of the piezoelectric substrate to the other end thereof, wherein the plurality of grooves being formed by grinding.

9. The fabricating process according to claim 8, wherein
at least one comb transducer is formed on a surface of a wafer constituted of a piezoelectric member;
said at least one wafer is placed on a rotary table in a state that a back surface of the wafer faces upward, said at least one wafer being arranged in a rotating direction of the rotary table,
the rotary table is rotated about an axis of rotation thereof,
grinding means is rotated about an axis of rotation thereof,
the grinding means being tilted relative to a rotary plane of the rotary table at a predetermined angle in such a manner that the grinding means is contacted with said wafer located at a certain spatial position, whereby a plurality of grooves are formed in the back surface of the wafer.

10. The fabricating process according to claim 9, wherein the grinding means includes a plurality of grinding segments segmented in the rotating direction of the grinding means, the adjoining grinding segments being separated from each other by a clearance.

11. The fabricating process according to claim 10, wherein a length of the clearance in the rotating direction of the grinding means is not smaller than 2.5% and not larger than 50% relative to a length of the grinding segment in the rotating direction of the grinding means.

12. The fabricating process according to claim 10, wherein the grinding segment has such a surface roughness as to make a depth of the groove formed in the back surface of the wafer of not smaller than 0.5% relative to a wavelength of a surface acoustic wave propagating through the wafer.

13. The fabricating process according to claim 10, wherein respective rotating numbers of the rotary table and of the grinding means per unit time, and a surface roughness of the grinding segment are controlled in such a manner that a maximum interval of the adjoining grooves among the plurality of grooves is not smaller than 10% and not larger than 500% relative to a wavelength of a surface acoustic wave propagating through the wafer.

14. The fabricating process according to claim 10, wherein the grinding segments have at least two different surface roughness from each other.

15. The fabricating process according to claim 14, wherein the grinding segments of the grinding means have at least three different surface roughness including a first surface roughness, a second surface roughness, and a third surface roughness, the surface roughness is increased or decreased stepwise in the order from the first, the second, and the third surface roughness, and the grinding segments are arranged in such a manner that the grinding segment having the first surface roughness and the grinding segment having the second surface roughness are disposed adjacent to each other, or the grinding segment having the second surface roughness and the grinding segment having the third surface roughness are disposed adjacent to each other if the grinding segments having the different surface roughness are disposed adjacent to each other.

16. The fabricating process according to claim 15, wherein the grinding segments having the different surface roughness are arranged orderly.

* * * * *